United States Patent [19]

Dingwall

[11] 4,105,950
[45] Aug. 8, 1978

[54] VOLTAGE CONTROLLED OSCILLATOR (VCO) EMPLOYING NESTED OSCILLATING LOOPS

[75] Inventor: Andrew Gordon Francis Dingwall, Bridgewater, N.J.

[73] Assignee: RCA Corporation, New York, N.Y.

[21] Appl. No.: 832,285

[22] Filed: Sep. 12, 1977

[30] Foreign Application Priority Data

Sep. 13, 1976 [GB] United Kingdom ............. 37853/76

[51] Int. Cl.² .................... H03B 3/04; H03B 5/24; H03K 3/282
[52] U.S. Cl. ....................... 331/57; 331/108 D; 331/111; 331/135; 331/143; 331/177 R
[58] Field of Search .............. 331/57, 108 B, 108 C, 331/108 D, 111, 113 R, 135, 143, 177 R

[56] References Cited

U.S. PATENT DOCUMENTS

| | | | |
|---|---|---|---|
| 3,676,801 | 7/1972 | Musa | 331/116 R |
| 3,863,179 | 1/1975 | Goo | 331/108 D |
| 3,878,482 | 4/1975 | Schowe, Jr. | 331/108 D |
| 3,904,988 | 9/1975 | Hsiao | 331/111 |
| 3,931,588 | 1/1976 | Gehweiler | 331/57 |

*Primary Examiner*—Siegfried H. Grimm
*Attorney, Agent, or Firm*—H. Christoffersen; Henry I. Schanzer

[57] ABSTRACT

The VCO is comprised of first and second "nested" oscillating loops. The first loop includes M cascaded inverters interconnected to normally oscillate at a given fixed frequency. The second loop includes N cascaded inverters where the input of the first of the N inverters is connected to the output of one of the M inverters and where the output of the Nth inverter is coupled to the output of a different one of the M inverters, whereby at least one of the M inverters is common to the two loops, and where M and N are integers. A control voltage is coupled to at least one of the N inverters to vary its conductivity and cause the frequency of oscillation of the two loops to change.

6 Claims, 5 Drawing Figures

VOLTAGE CONTROLLED OSCILLATOR (VCO) EMPLOYING NESTED OSCILLATING LOOPS

This invention relates to voltage controlled oscillators (VCOs) having a fixed frequency output in the absence of an input control voltage ($V_C$) and a well-controlled frequency response as a function of $V_C$.

Figure 1A:
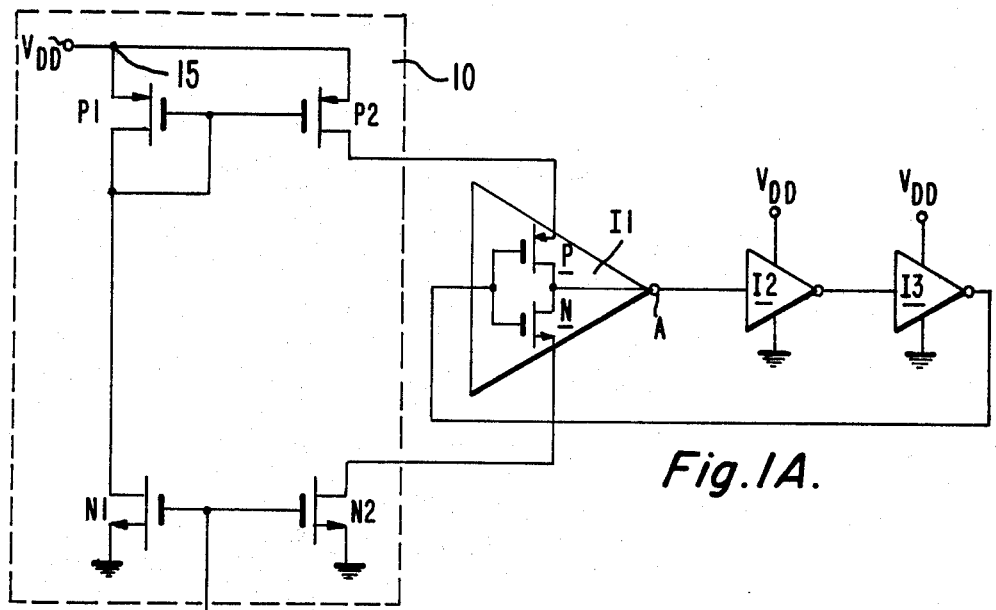
FIG. 1A is a schematic diagram of a known VCO.

Voltage Controlled Oscillators are used in numerous applications. One of these is in frequency synthesizers for CB radios to generate various ones of the channel frequencies. Typically, the output of the VCO is divided down by a counter and then fed into a phase comparator to which is also applied the output of a reference oscillator. The output of the phase comparator is then used to generate a control voltage ($V_C$) which controls the potential applied to the VCO and hence its frequency of oscillation.

Numerous VCO circuits are known and are commercially available. However, these circuits suffer from one or more of the following disadvantages:

a. deadband—for values of $V_C$ below a certain level there is no oscillation of the circuit;

b. the frequency variations of the oscillator are too rapid for small variations in $V_C$; and c. a tank circuit may be required to load down one of the nodes of the circuit.

These disadvantages are illustrated by reference to FIG. 1A which shows a "single loop" VCO of the type described in my pending U.S. application Ser. No. 783,657, titled VOLTAGE CONTROLLED OSCILLATOR, and assigned to RCA Corporation.

Cascaded inverters I1, I2, and I3, with the output of I3 fed back to the input of I1, form a ring oscillator. A fixed operating voltage ($V_{DD}$ and GND) is applied to inverters I2 and I3 while the voltage and current supplied to inverter I1 are varied by means of a current mirror arrangement 10, responsive to a control voltage, $V_C$, applied to terminal 19. The current mirror 10 includes insulated-gate field-effect transistors (IGFETs) P1, P2, N1 and N2. Transistors P1 and N1 whose conduction paths are serially connected between $V_{DD}$ and ground pass the same current. The current through transistors P1 and N1 is mirrored through transistors P2 and N2 whose gate to source regions are connected in parallel with those of P1 and N1, respectively. When the value of $V_C$ applied to the gates of transistors N1 and N2 exceeds their threshold voltage ($V_T$), currents flow through P2 and N2 and oscillation begins. The frequency of oscillation of the ring oscillator depends on the current passed via controlled current source transistor P2 and controlled current sink transistor N2 to the output A of inverter I1. As shown in FIG. 1B, which depicts the frequency response of the circuit as a function of $V_C$, the frequency of oscillation rises rapidly from zero Hz to about 50 MHz for a change in $V_C$ of 2 or 3 volts (above $V_T$ volts). Where, as shown in FIG. 1B, the desired frequency band is narrow (e.g., 16.5 to 17.5 MHz), the corresponding range of $V_C$ is very small, and voltage perturbations of even a vew millivolts (due to noise or switching) on the control line result in excessive frequency shifts.

The problem of excessive frequency shift may be resolved by using a resonant tank circuit connected to one of the nodes (e.g., A) of the oscillator circuit. But, as the oscillator is operated away from the resonant frequency of the tank circuit, there is considerable power dissipation due to the decreased impedance of the tank. Secondly, and perhaps most importantly, tank circuits require inductance(s) and capacitance(s). The inductance cannot be manufactured readily as part of an integrated circuit (IC) and it is impractical to manufacture large values of capacitance on an IC. Thus, the circuit of FIG. 1A has a deadband, excessive frequency shift (for some applications), and may require a tank circuit to contain the frequency of oscillation within a given range.

Applicant has found that the disadvantages discussed above may be avoided by "nesting" one oscillating loop within another oscillating loop; where "nesting" as used herein refers to the sharing by the two loops of at least one common element causing the two loops to oscillate at the same frequency. One loop is designed to, normally, oscillate at a given frequency when a control voltage coupled to the other loop is below a given level. The other loop includes means responsive to the control voltage which, when the control voltage exceeds the given level, varies the frequency of oscillation of the two loops. The one loop ensures a fixed oscillator frequency during the deadband (when $V_C$ is less than $V_T$) and functions as a tuned tank circuit. As a result, increased linearity of response is achieved with lower power dissipation than with known tank circuits. These and other advantages of the invention may best be explained with reference to the remaining drawings.

Figure 2:
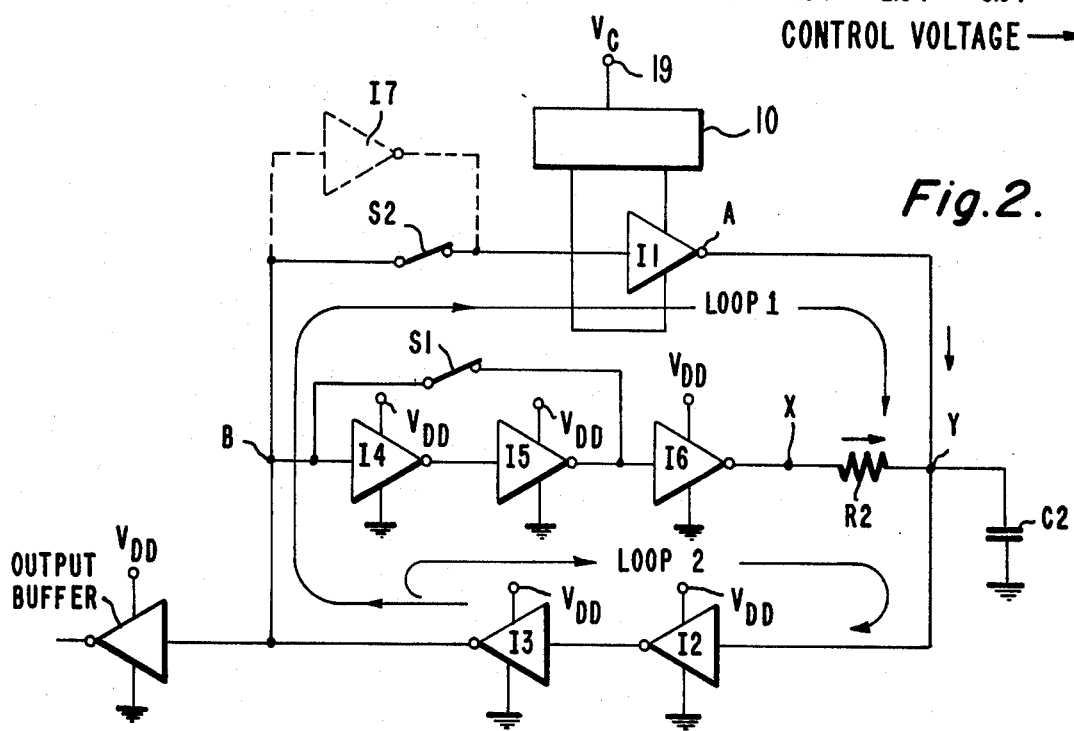
FIG. 2 is a schematic diagram of a VCO employing nested oscillator loops in accordance with the invention.

The VCO circuit of FIG. 2 includes two loops. The first loop, 1, which is essentially the same as the circuit shown in FIG. 1A, includes a voltage controlled ring oscillator loop comprised of inverters I1, I2 and I3. The input of inverter I1 is connected via switch S2 to node B and its output, A, is connected to node Y. Inverters I2 and I3 are connected in cascade between nodes Y and B in a direction to produce an output at node B in response to an input at node Y. The operating potential applied across I1 and hence the current supplied to, and by, inverter I1 is controlled by a current mirror network 10 responsive to an input control voltage ($V_C$) applied to terminal 19, as described for FIG. 1A.

The operation of loop 1 has been discussed above, a similar circuit is discussed in detail in my application cited above, and therefore, the operation of loop 1 will not be discussed in great detail at this point. Suffice it to say, that for $V_C$ below $V_T$, inverter I1 does not conduct, it supplies no output current and the loop does not oscillate. For $V_C$ increasing above $V_T$, the output current (being supplied and sinked) at node A of inverter I1 increases and loop 1 oscillates at higher rates corresponding to the higher currents produced by I1.

The second loop 2, includes an odd number of inverters (I2, I3, I4, I5 and I6), two of which (I2, I3) are common to loop 1. Inverters I4, I5 and I6 are connected in cascade, with the input of inverter I4 connected to node B and with the output of inverter I6 connected to terminal X. A resistor R2 is connected between terminal X and node Y, and a capacitor C2 is connected between node Y and ground.

Where the inverters are interconnected by direct current (d.c.) connections (wires or resistors), an odd number of inverters have to be connected in a series (cascaded) loop to provide an unstable configuration assuring oscillation of the loop. Loop 2 is shown with five inverters (I2, I3, I4, I5 and I6); in a breadboarded circuit it was found that the output of the oscillator contained less harmonics when five, rather than three, inverters were connected in the loop. However, for ease of the description to follow, it is assumed that inverters I4 and I5 are short circuited by means of normally closed switch S1 connected between the input of inverter I4 and the output of inverter I5.

In the circuit of FIG. 2 all the inverters except for inverter I1 have $V_{DD}$ volts and ground applied to their appropriate power terminals.

With its inverters powered and with I1 non-conducting, loop 2 oscillates at a rate determined by the capacitance at the input and output of each inverter, the potential across the inverters ($V_{DD}$ and ground), the current flowing through the inverting stages (since the stage current determines the rate at which nodal capacitances can be charged or discharged), the open loop gain, and the frequency response of the transistors forming the inverters. Ring oscillators comprising three cascaded complementary inverters were built (with R2 shorted and without the addition of capacitance C2) and, when operated at $V_{DD}$ equal to 10 volts, oscillated in a free running mode at about 100 MHz.

To have loop 2 generate a reproducible predetermined frequency of oscillation, and to reduce the effect of variations in inverter response in each circuit, and from circuit to circuit, a passive reactive network (R2, C2) is included in the loop.

By making R2 greater than the equivalent output resistance ($R_0$) of I6 and by making C2 significantly greater than the stray or distributed capacitance at any of the other nodes of the circuit, R2 and C2 dominate the other circuit parameters and, therefore, control and set the frequency of oscillation of loop 2. For this condition, the frequency of oscillation of loop 2 (with I1 non-conducting) is determined by the rate at which inverter I6 can charge or discharge capacitor C2, and may be calculated, to a first approximation, as follows:

$$f_{Osc} = 1/(2\pi \cdot RC)$$

where R is equal to R2 plus $R_O$ of I6 (when inverter I1 is non-conducting) and C = C2.

Figure 1B:
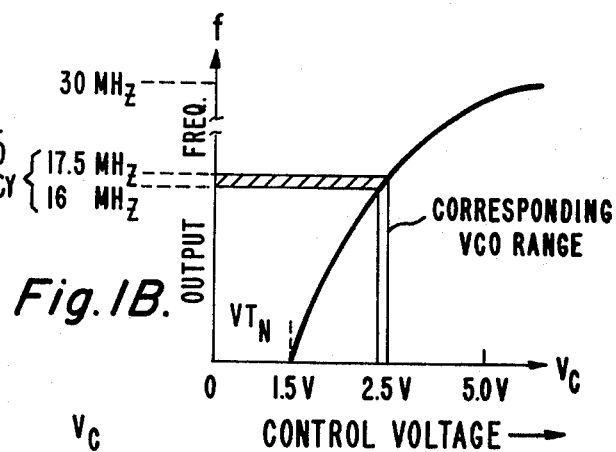
FIG. 1B is a diagram showing the change in frequency as a function of control voltage ($V_C$) for the circuit of FIG. 1A.
Figure 3:
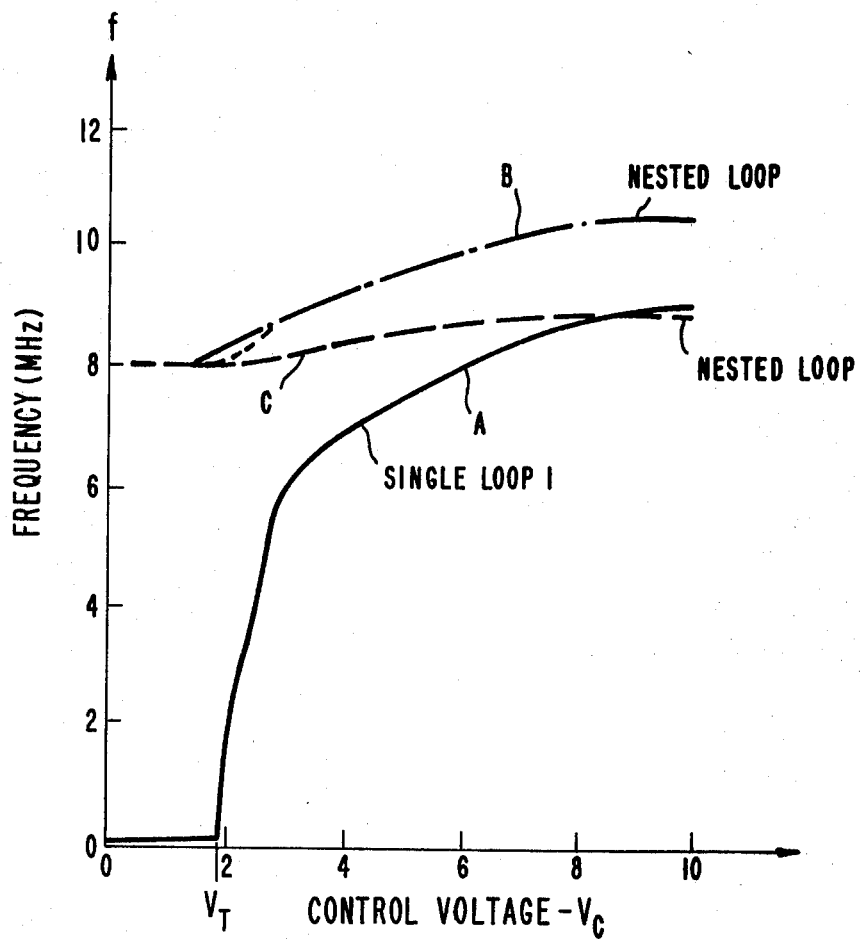
FIG. 3 is a diagram of the frequency response versus $V_C$ of the circuit of FIG. 2 for different conditions of the nested loops.

The circuit of FIG. 2 was breadboarded using inverters of the complementary conductivity type shown in FIG. 1A, with R2 set to 500 ohms, C2 set to 30 picofarads and with a $V_{DD}$ of 10 volts applied across all the inverters except I1. The measured frequency of oscillation of loop 2 (for $V_C = 0$) was just above 8MHz, which corresponds to $R_0$ of inverter I6 being approximately 150 ohms. To better explain the operation of the circuit reference is made to FIG. 3 which graphs results obtained from the breadboarded circuit under different operating conditions.

To better demonstrate the effect of "nesting" the two loops, the breadboarded circuit was operated with the branch comprising inverters I4, I5, I6 and resistor R2 opened and thus not in the circuit, but with a capacitor C2 of 30 picofarads (30 × 10$^{-12}$F) connected between node Y and ground. The response of the "single-loop" (i.e., loop 1) operation is shown in waveform A of FIG. 3. Note that there is a deadband ($F = $ 0Hz) for values of $V_C$ below about 2 volts, followed by a sharp increase in frequency for $V_C$ between 2 and 4 volts and a somewhat slower rise in frequency as $V_C$ increases above 4 volts. The slower rise in frequency for $V_C$ above 4 volts is due, in part, to C2.

The breadboarded circuit was then operated with inverters I1 and I6 connected in parallel between node B and terminal X, with a resistor R2 of 500 ohms and a C2 of 30pf. As noted above and as shown in waveform B of FIG. 3, for values of $V_C$ less than $V_T$ (with I1 non-conducting) the circuit (i.e., loop 2) oscillated at approximately 8 MHz. Inverter I6 produces an alternating current which alternately charges and discharges node Y producing a signal fed back to node B via inverters I2 and I3. For sustained oscillation the Barkhausen criteria must be met; i.e., the loop phase shift must be 360° or an integer multiple thereof and with a gain of at least one. Hence, the phase shift across each inverter at the frequency of oscillation is greater than 180° such that together with the shift due to the RC network a phase shift of $n \times 360°$ is obtained around the loop.

With $V_C$ above $V_T$ volts, I1 is rendered conducting. With the inputs of I1 and I6 directly connected to node B (switches S1 and S2 closed) the same signal is applied to their inputs. These two inverters being of similar construction produce output currents which will, therefore, be in-phase. Hence the output current of inverter I1 flows into node Y where it is summed algebraically with the output current produced by inverter I6. For the in-phase condition, more current flows into node Y, charging and discharging it faster and thus increasing the frequency of oscillation. As before, the signal produced at node Y is fed back to node B via inverters I2 and I3. The signal at node B is applied to the paralleled inverters I1 and I6. These two inverters are then locked in on the same signal and respond in phase. As shown in waveform B of FIG. 3 the oscillator frequency is higher when both I1 and I6 are conducting in-phase. Summing the currents from the two loops does not result in the sharp change in frequency for a given change in $V_C$ experienced for single loop operation. Rather, a higher frequency of oscillation is obtained with greater linearity. Loops 1 and 2 operate at the same frequency since they share the same elements (inverters I2, I3) and the combination of the two loops functions as a single oscillator. There is no modulation of one frequency signal by another frequency signal as would occur if the two loops were operated independently and their outputs subsequently mixed.

One effect of "nesting" loops 1 and 2 is that the resulting frequency response versus $V_C$ is similar to the response obtained by connecting a tank circuit to node Y. But, in sharp contrast thereto, there is no need for an inductance and there is less power dissipation than with a tank circuit.

In the circuit of FIG. 2 the output A of inverter I1 may be connected to terminal X instead of to node Y. The effect of this connection is to further decrease the rate at which the frequency of oscillation changes versus $V_C$ as shown in waveform C of FIG. 3. For the connection of output A to terminal X the output resistances of inverters I1 and I6 are effectively connected in parallel with each other and then connected in series with R2. This connection further reduces the effect of I1 and thus lowers the maximum frequency obtainable.

An important aspect of the circuit of FIG. 2 is the recognition that the output currents of inverters I1 and I6 are algebraically summed. Where the signals applied to the inputs of the two inverters are in-phase (when their two inputs are direct current connected to the same node) the frequency of oscillation increases as I1 is made more conductive.

By applying out-of-phase signals to the inputs of inverters I1 and I6, the frequency of oscillation may be made to decrease with increasing $V_C$. This may be achieved, for example, by opening switch S2 and connecting an inverter I7, shown with dashed lines in FIG. 2, between node B and the input of inverter I1.

Since an even number of inverters is then connected in series in loop 1, it does not oscillate unconditionally. But, with $V_C$ less than $V_T$, loop 2 still oscillates at its set frequency. As $V_C$ increases above $V_T$, the output current of I1 increases. But, with inverter I7 in series with inverter I1, the signal applied to the input of inverter I1 is out-of-phase with the signal applied to inverter I6. The output current supplied by inverter I1 into node Y then subtracts from the output current supplied by I6. Consequently, for out-of-phase operation, the frequency of oscillation decreases for and increasing $V_C$. Thus, the output characteristic of the VCO may be shaped to increase or decrease depending on whether an in-phase or an out-of-phase mode of operation is selected.

In the description and in the testing of the circuits, complementary inverters of the type shown for inverter I1 in FIG. 1A were used, but it should be understood that any other suitable inverter could be used instead.

Also, only one controlled inverter (i.e., I1) was shown, but other controlled inverters could have been added to loop 1 or in branches parallel to the branch including inverter I1 between nodes B and Y.

Figure 4:
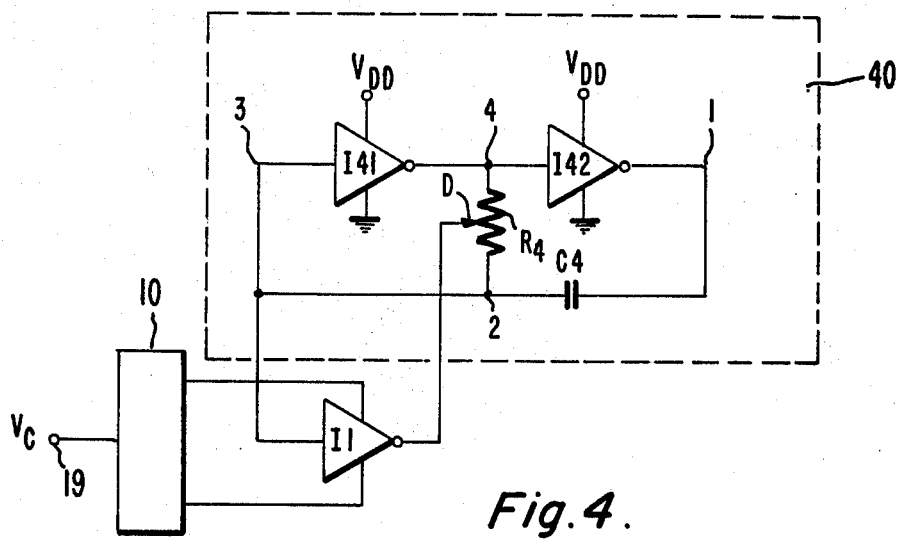
FIG. 4 is a schematic diagram of another VCO embodying the invention.

In the circuit of FIG. 4 the frequency of oscillation of an astable multivibrator 40 is varied and controlled by means of inverter I1. The circuit 40 includes two cascaded inverters I41, I42 with resistor R4 connected between the input and output of I41 and capacitor C4 connected between the output of I42 and the input of I41. Inverter I1, whose conductivity is controlled by $V_C$ applied to the current mirror arrangement 10, is connected at its input to node 3 to which is connected the input of I41, and is connected at its output to a point D along R4 between nodes 2 and 4. The operation of the astable circuit 40 will not be detailed since it is well known and described, among others, in Application Note ICAN 6466, published May 1976 by RCA Corporation. When inverter I1 is non-conductive, during one portion of the cycle, terminal 1 of capacitor C4 is positively charged towards $V_{DD}$ by the output of I42 and terminal 2 of capacitor C4 is discharged via resistor R4 and the output of inverter I41 towards ground. During another portion of the cycle, terminal 2 of capacitor C4 is positively charged towards $V_{DD}$ by the output of I41 via resistor R4, and terminal 1 of C4 is returned to ground via the output of I42.

When I1 is rendered conductive by $V_C$ exceeding $V_T$, it supplies a current into node D which is in-phase with the output current produced by I41. This additional current charges and discharges C4 faster and hence the frequency of oscillation of this nested arrangement is varied as a function of $V_C$. The circuit of FIG. 4 thus illustrates that the invention may be practiced with oscillating loops (e.g., astable multivibrator) other than ring oscillators.

Note that the loop which includes cascaded inverters I41, I42 is closed by means of capacitor C4 which provides alternating current (AC) feedback between the output of I42 and the input of I41. In contrast to the resistively coupled ring oscillator loop 2 of FIG. 2 which requires an odd number of inverters to oscillate, the AC coupled loop sustains oscillation with an even number of inverters in the loop.

What is claimed is:

1. A voltage controlled oscillator comprising:
   first and second terminals;
   an input terminal adapted to receive a control voltage;
   R, S and F cascaded inverters, where R, S and F are integers;
   means connecting said R inverters and said S inverters in parallel between said first and second terminals; said R and S inverters being connected in a direction to produce an output at said second terminal in response to an input at said first terminal;
   means connecting said F inverters between said second and said first terminals in a direction to produce an output at said first terminal in response to an input at said second terminal; said R and F inverters forming a loop when said control voltage is below a given level, which normally oscillates at a given frequency; and
   means receptive to said control voltage being coupled to at least one of said S inverters for varying its conductivity and output current in response to said control voltage being above said given level and, in turn, varying the frequency of oscillation of said loop and said oscillator.

2. The combination as claimed in claim 1 wherein said means connecting said R inverters includes a resistor connected between the output of the Rth of said R inverters and said second terminal; and wherein a capacitance greater in value than any stray capacitance associated with said R, S and F inverters is connected between said second terminal and a point of fixed operating potential.

3. The combination as claimed in claim 2 wherein R and S are each equal to 1 and F is equal to 2.

4. The combination as claimed in claim 1 wherein R, S and F are each equal to 1; wherein said means connecting said F inverters between said second and first terminals includes a capacitor connected between the output of said F inverter and said first terminal; and
   wherein said means connecting said R and S inverters in parallel includes means direct current connecting the inputs of said R and S inverters via negligible impedance means to said first terminal and resistive means connecting the output of one of said R and S inverters to said second terminal.

5. A voltage controlled oscillator comprising:
   M inverters connected in cascade, and N inverters connected in cascade; where M and N are integers;
   means connecting the output of the Mth of said M inverters to the input of the first one of said M inverters for forming a loop normally oscillating at a predetermined frequency;
   means connecting the input of the first of said N inverters to the output of one of said M inverters, and means connecting the output of the Nth of said N inverters to the output of a different one of said M inverters for forming a second loop; and
   means responsive to an input control voltage connected to at least one of said N inverters for altering its conductivity in response to said control voltage and thereby altering said predetermined frequency of oscillation.

6. In combination with a first, voltage controlled oscillator, loop comprised of N cascaded inverters; were N is an odd number equal to or greater than 1, and where the output of the Nth inverter is fed back to the input of the first inverter and where a control input voltage controls the voltage and current applied to at least one of the inverters of the first loop for controlling its frequency of oscillation, the improvement comprising:

R cascaded inverters;

means connecting the input of the first of said R inverters to the output of one of said N inverters; and means including a reactive network connected between the output of the Rth of said R inverters and the output of a different one of said N inverters for forming a second oscillating loop and said reactive network being selected to cause said second loop to normally oscillate at a predetermined frequency when said control input voltage is below a given value.

* * * * *